(12) United States Patent
Veprik (10) Patent No.: US 11,854,858 B2
(45) Date of Patent: Dec. 26, 2023

(54) EXPANDER UNIT WITH MAGNETIC SPRING FOR A SPLIT STIRLING CRYOGENIC REFRIGERATION DEVICE

(71) Applicant: CRYO TECH LTD., Ein Harod (IL)

(72) Inventor: Alexander Veprik, Kiriyat Motzkin (IL)

(73) Assignee: CRYO TECH LTD., Ein Harod (IL)

( * ) Notice: Subject to any disclaimer, the term of this patent is extended or adjusted under 35 U.S.C. 154(b) by 351 days.

(21) Appl. No.: 17/325,334

(22) Filed: May 20, 2021

(65) Prior Publication Data

US 2022/0250169 A1 Aug. 11, 2022

(51) Int. Cl.
*F25B 9/14* (2006.01)
*H01L 21/683* (2006.01)
*B23B 31/30* (2006.01)

(52) U.S. Cl.
CPC ........ *H01L 21/6838* (2013.01); *B23B 31/307* (2013.01); *F25B 9/145* (2013.01); *F25B 9/14* (2013.01); *F25B 2309/003* (2013.01)

(58) Field of Classification Search
CPC .................. F25B 9/14; F25B 2309/003; F25B 2309/1415
See application file for complete search history.

(56) References Cited

U.S. PATENT DOCUMENTS 4,404,808 A * 9/1983 Andeen ................. F02G 1/0445
505/895
4,475,335 A 10/1984 Davey 2004/0000149 A1 * 1/2004 Kirkconnell ............ F28D 17/02
165/4
(Continued)

FOREIGN PATENT DOCUMENTS

DE 3812427 10/1989
KR 20060045109 5/2006

OTHER PUBLICATIONS

Knox, L., P. Patt, and R. Maresca. "Design of a flight qualified long-life cryocooler." NBS Proc. of the 3rd Cyrocooler Conf.. 1985.
(Continued)

*Primary Examiner* — Brian M King
(74) *Attorney, Agent, or Firm* — PEARL COHEN ZEDEK LATZER BARATZ LLP (57) ABSTRACT

An expander unit of a cryogenic refrigerator device includes a moving assembly with a porous regenerative heat exchanger configured to move back and forth along a longitudinal axis. A magnetic spring assembly includes a stationary magnetic assembly fixed to the cold finger base that includes one or more magnetic rings fixedly arranged about a bore. A movable magnetic assembly includes one or more movable magnetic rings fixed to the moving assembly. An outer lateral dimension of each of the movable magnetic rings is less than an inner lateral dimension of the bore. The stationary magnetic assembly and the movable magnetic assembly are configured such that, when the moving assembly is displaced along the longitudinal axis from an equilibrium position, attractive and repulsive forces between the movable magnetic assembly and the stationary magnetic assembly yield a restoring force that is directed to restore the moving assembly to the equilibrium position.

17 Claims, 6 Drawing Sheets

(56) References Cited

U.S. PATENT DOCUMENTS

2006/0254270 A1* 11/2006 Tanaka ................ F02G 1/045
　　　　　　　　　　　　　　　　　　　　　　60/517
2018/0051916 A1* 2/2018 Eguchi ................ F25B 9/145
2021/0033313 A1 2/2021 Verpik

OTHER PUBLICATIONS

Guo Yong et al. "Analysis of the flow and regeneration characteristics of screen mesh and parallel wire regenerators." In *Applied Mechanics and Materials*, vol. 44, pp. 1285-1289. Trans. Tech Publications Ltd, 2011.

Radebaugh, Ray et al. "A simple, first step to the optimization of regenerator geometry." In *Proc. of the 3rd Cryocooler Conf.* 1985.

Nam et al. "Development of parallel wire regenerator for cryocoolers." Cryogenics 46, No. 4 (2006): 278-287.

* cited by examiner

EXPANDER UNIT WITH MAGNETIC SPRING FOR A SPLIT STIRLING CRYOGENIC REFRIGERATION DEVICE

FIELD OF THE INVENTION

The present invention relates to cryogenic refrigeration devices. More particularly, the present invention relates to a pneumatic rodless expander unit of a split Stirling cryogenic refrigeration device that includes a magnetic spring and a parallel wire regenerative heat exchanger.

BACKGROUND OF THE INVENTION

The second law of thermodynamics states that heat spontaneously flows from warmer objects to cooler objects. The direction of heat flow may, however, be reversed to pump heat from an object that has a temperature lower than that of its surroundings by applying external work. This principle is employed in cooling devices such as heat pumps (refrigerators), where the heat is absorbed at a cool location and ejected to a warmer environment. In the case where the cool location is cooled to cryogenic temperatures, such a cooling device is sometimes referred to as a "cryocooler".

For example, a cryocooler may be used to maintain an infrared detector of an infrared imager at a cryogenic temperature in order to attenuate intrinsic thermally-induced noise, thus enabling long working ranges, short integration times along with high spatial and temperature resolution. A cooling device for such an application must often be sufficiently small so as to fit inside an infrared imager or other electro-optical device in which the detector is incorporated.

Typically, such a cryocooler operates on the basis of a closed Stirling thermodynamic cycle, during which a gaseous working agent (e.g., helium, nitrogen, or another suitable, usually inert, gas) is cyclically compressed in a piston compression unit (compressor) and allowed to cyclically expand within a pneumatic expander unit while performing mechanical work on an expansion piston (displacer), thus resulting in a favorable cooling effect.

The expansion work is typically recovered and further used to support actuation of the compression piston. Recovery of expansion work is a key feature of Stirling cryogenic refrigeration devices and a major contributor to their superior performance.

A cold tip of the cold finger that includes an expansion chamber is placed in thermal contact with the detector or other object that is to be cooled. Heat is removed from the cooled object during an expansion phase of the thermodynamic cycle. A pneumatically actuated expansion piston (displacer), containing a porous regenerative heat exchanger, is moved back and forth within the cold finger to transfer heat from the expansion chamber to a warm chamber at a base of the expander unit, typically at the opposite end of the expander unit from the expansion chamber. The transferred heat is rejected to the environment from the warm chamber during a compression stage of the thermodynamic cycle.

In a split cryogenic cooler, the gaseous working agent is cyclically compressed and expanded at a driving frequency by the reciprocating motion of a piston in a compression chamber of a separate compression unit. The compression chamber is in direct pneumatic communication with the warm chamber of the expander unit via a flexible transfer line (e.g., a flexible tube) through which the gaseous working agent may flow back and forth. The expansion chamber of the rodless pneumatic expander unit is separated from the warm chamber by the displacer. The displacer is provided with a spring, thus forming a mass-spring oscillator whose resonant frequency is determined by the mass of the displacer and by the spring constant of the spring. Typically, the driving frequency is approximately equal to the resonant frequency of the displacer.

SUMMARY OF THE INVENTION

There is thus provided, in accordance with an embodiment of the invention, an expander unit of a cryogenic refrigerator device, the expander unit including: a cold finger tube extending distally from a cold finger base and configured to enclose a gaseous working agent, the cold finger base being connectable via a transfer line to a compressor unit; a moving assembly including a displacer tube containing a porous regenerative heat exchanger that is permeable to the gaseous working agent and that is configured to move back and forth along a longitudinal axis between an expansion chamber at a distal end of the cold finger tube and a warm chamber at a proximal end of the cold finger base as the gaseous working agent is alternately compressed and decompressed by the compressor unit; and a magnetic spring assembly including a stationary magnetic assembly fixed to the cold finger base, the stationary magnetic assembly including one or more magnetic rings fixedly arranged about a bore, and a movable magnetic assembly that includes one or more movable magnetic rings fixed to the moving assembly, wherein an outer lateral dimension of each of the movable magnetic rings is less than an inner lateral dimension of the bore, and wherein the stationary magnetic assembly and the movable magnetic assembly are configured such that, when the moving assembly is displaced along the longitudinal axis from an equilibrium position, attractive and repulsive forces between the movable magnetic assembly and the stationary magnetic assembly yield a restoring force that is directed to restore the moving assembly to the equilibrium position.

Furthermore, in accordance with an embodiment of the invention, the stationary magnetic assembly includes two coaxial stationary magnetic rings that are axially displaced from one another, and the movable magnetic assembly includes one movable magnetic ring, the directions of magnetization of the stationary magnetic rings and the movable magnetic ring being identical to one another and parallel to the longitudinal axis.

Furthermore, in accordance with an embodiment of the invention, an axial space between the two stationary magnetic rings is filled with a nonmagnetic spacer.

Furthermore, in accordance with an embodiment of the invention, the stationary magnetic assembly is fixed within the cold finger base or outside of the cold finger base.

Furthermore, in accordance with an embodiment of the invention, a bore of each of the one or more movable magnetic rings surrounds a conduit that enables the gaseous working agent to flow between the heat exchanger and the warm chamber.

Furthermore, in accordance with an embodiment of the invention, the regenerative heat exchanger includes a plurality of parallel filaments that are oriented substantially parallel to the longitudinal axis.

Furthermore, in accordance with an embodiment of the invention, the filaments include a polymeric material.

Furthermore, in accordance with an embodiment of the invention, the polymeric material includes nylon or polyester.

Furthermore, in accordance with an embodiment of the invention, the filaments include a composite material including metal and polymeric material.

Furthermore, in accordance with an embodiment of the invention, directions of magnetization of the magnetic rings of the stationary magnetic assembly and the movable magnetic assembly are perpendicular to the longitudinal axis.

Furthermore, in accordance with an embodiment of the invention, the magnetic rings of the stationary magnetic assembly and the movable magnetic assembly are magnetized radially with respect to the longitudinal axis.

Furthermore, in accordance with an embodiment of the invention, the magnetic rings of the stationary magnetic assembly and the movable magnetic assembly are magnetized diametrically with respect to the longitudinal axis.

Furthermore, in accordance with an embodiment of the invention, a cross section of the stationary magnetic ring is trapezoidal.

Furthermore, in accordance with an embodiment of the invention, a wide base of the trapezoidal cross section faces inward.

Furthermore, in accordance with an embodiment of the invention, a space within the stationary magnetic assembly or the movable magnetic assembly is filled with a nonmagnetic spacer.

Furthermore, in accordance with an embodiment of the invention, the stationary magnetic assembly and the movable magnetic assembly are configured such that a magnitude of the restoring force is proportional to the magnitude of the displacement of the moving assembly from the equilibrium position.

There is further provided, in accordance with an embodiment of the invention, an expander unit of a cryogenic refrigerator device, the expander unit including: a cold finger tube extending distally from a cold finger base and configured to enclose a gaseous working agent, the cold finger base being connectable via a transfer line to a compressor unit; and a moving assembly including a displacer tube containing porous regenerative heat exchanger that is permeable to the gaseous working agent and that is configured to move back and forth along a longitudinal axis between an a expansion chamber at a distal end of the cold finger tube and a warm chamber at a proximal end of the cold finger base as the gaseous working agent is alternately compressed and decompressed by the compressor unit, wherein the heat exchanger includes a plurality of parallel filaments of a polymeric material that are oriented substantially parallel to the longitudinal axis.

Furthermore, in accordance with an embodiment of the invention, the polymeric material includes nylon or polyester.

Furthermore, in accordance with an embodiment of the invention, the polymeric material includes composite material including metal and polymeric material.

There is further provided, in accordance with an embodiment of the present invention, an expander unit of a cryogenic refrigerator device, the expander unit including: a cold finger tube extending distally from a cold finger base and configured to enclose a gaseous working agent, the cold finger base being connectable via a transfer line to a compressor unit; a moving assembly including a displacer tube containing a porous regenerative heat exchanger that is permeable to the gaseous working agent and that is configured to move back and forth along a longitudinal axis between an expansion chamber at a distal end of the cold finger tube and a warm chamber at a proximal end of the cold finger base as the gaseous working agent is alternately compressed and decompressed by the compressor unit; and a magnetic spring assembly including a stationary magnetic assembly fixed to the cold finger base, the stationary magnetic assembly including a tubular magnet, and a movable assembly that includes a ferromagnetic ring that is fixed to the moving assembly, an outer lateral dimension of the ferromagnetic ring being less than an inner lateral dimension of the tubular magnet, and wherein the stationary magnetic assembly and the movable assembly are configured such that, when the moving assembly is displaced along the longitudinal axis from an equilibrium position, attractive forces between the movable assembly and the stationary magnetic assembly yield a restoring force that is directed to restore the moving assembly to the equilibrium position.

BRIEF DESCRIPTION OF THE DRAWINGS

In order for the present invention to be better understood and for its practical applications to be appreciated, the following Figures are provided and referenced hereafter. It should be noted that the Figures are given as examples only and in no way limit the scope of the invention. Like components are denoted by like reference numerals.

DETAILED DESCRIPTION OF THE INVENTION

In the following detailed description, numerous specific details are set forth in order to provide a thorough understanding of the invention. However, it will be understood by those of ordinary skill in the art that the invention may be practiced without these specific details. In other instances, well-known methods, procedures, components, modules, units and/or circuits have not been described in detail so as not to obscure the invention.

Although embodiments of the invention are not limited in this regard, discussions utilizing terms such as, for example, "processing," "computing," "calculating," "determining," "establishing", "analyzing", "checking", or the like, may refer to operation(s) and/or process(es) of a computer, a computing platform, a computing system, or other electronic computing device, that manipulates and/or transforms data represented as physical (e.g., electronic) quantities within the computer's registers and/or memories into other data similarly represented as physical quantities within the computer's registers and/or memories or other information non-transitory storage medium (e.g., a memory) that may store instructions to perform operations and/or processes. Although embodiments of the invention are not limited in this regard, the terms "plurality" and "a plurality" as used herein may include, for example, "multiple" or "two or more". The terms "plurality" or "a plurality" may be used throughout the specification to describe two or more components, devices, elements, units, parameters, or the like. Unless explicitly stated, the method embodiments described herein are not constrained to a particular order or sequence. Additionally, some of the described method embodiments or elements thereof can occur or be performed simultaneously, at the same point in time, or concurrently. Unless otherwise indicated, the conjunction "or" as used herein is to be understood as inclusive (any or all of the stated options).

In accordance with an embodiment of the invention, a split Stirling cryogenic refrigerator (or cryocooler) includes a compressor unit and an expander unit that are connected by a flexible transfer line. A gaseous working agent (e.g., helium, nitrogen, argon, or another suitable, typically inert, gas) is alternately compressed and decompressed by a piston within the compressor unit. The gaseous working agent also occupies all regions of the expander unit that are not occupied by nonporous solid structure (e.g., magnets or spacers as described below). The spaces filled by the gaseous working agent within the expander unit are connected to the gaseous working agent within the compressor unit via the transfer line, through which the gaseous working agent may flow back and forth, and via which changes in gas pressure within the compressor unit may be pneumatically transmitted to the expander unit. The transfer line typically includes a flexible sealed tube. The flexibility of the tube may enable placement of the compressor unit at a location where the compressor unit, or vibrations that are generated by operation of the compressor unit, do not interfere with operation of the cryogenic refrigeration device, or of a device (e.g., infrared detector) that is cooled by the cryogenic refrigeration device.

The expander unit includes a cold linger tube that extends distally from a cold finger base which is sealed by the rear cover that is pneumatically connected to the transfer line. The walls of the cold finger tube and of the cold finger base form a cold finger that is impermeable to the gaseous working agent. Thus, the gaseous working agent is completely enclosed and isolated from the ambient atmosphere by the expander unit, the transfer line, and the walls of the compressor unit.

A distal (from the cold finger base) end of the cold finger tube is configured to be placed in thermal contact with an object to be cooled. The walls of the cold finger tube are designed, e.g., by selection of material and thickness of the walls, to minimize a parasitic conduction of heat from the warm cold finger base to a cold finger tip.

A moving assembly is enclosed within the cold finger tube and supported from the base by a magnetic spring, thus forming a mechanical oscillator. The moving assembly includes a displacer tube that includes a regenerative heat exchanger in the form of a porous matrix, and at least one magnet of a magnetic spring assembly. The moving assembly is configured to move alternately distally toward the distal cold end of the cold finger tube and proximally toward the base of the expander unit. The moving assembly is driven by cyclic flow of the gaseous working agent through the regenerative heat exchanger as a result of cyclic motion of a piston within the compression unit.

The porous matrix, which is configured to be permeated by the gaseous working agent, functions during operation of the cryogenic refrigeration device as a regenerative heat exchanger. Drag forces are created between the flowing gaseous working agent and the moving regenerative heat exchanger. This drag force is typically dependent on the relative velocity of the gas flow and the displacer motion, and is the main force that drives the moving assembly.

The magnitude and phase of displacer motion are defined by the magnitude of the drag force, the mechanical friction between displacer and cold finger interior, and the resonant frequency of the spring-supported displacer.

Typically, the regenerative heat exchanger is constructed from a plurality of strands or fibers of a material that that are packed together at a desired porosity. For example, the density of the strands may be selected so as to enable the gaseous working agent to permeate the regenerative heat exchanger while enabling generation of a drag force between the gaseous working agent and the regenerative heat exchanger to drive the moving assembly. Typical arrangements of fibers in regenerative heat exchangers may include stacks of mesh screens or of randomly oriented fibers.

In some embodiments, the porous matrix may be configured to facilitate generation of a uniform drag force in the direction of motion of the displacer tube, and to facilitate exchange of heat between the porous matrix and the gaseous working agent. For example, the regenerative heat exchanger may be constructed from a plurality of parallel filaments, wires, strands, or fibers (these terms being used interchangeably herein) that are packed into, and oriented parallel to a longitudinal axis of, the displacer tube. The longitudinal axis of the displacer tube coincides with the direction of motion of the of the displacer tube.

Construction of the regenerative heat exchanger from longitudinally oriented parallel strands may be advantageous over regenerative heat exchangers with other arrangements of strands. In a parallel arrangement, the distribution of the strands across a cross section of the regenerative heat exchanger is uniform and homogenous. The relatively undisturbed (almost laminar) flow of the gaseous working agent within the straight channels that are formed between neighboring strands is similar to the flow of the gaseous working agent in the unoccupied spaces (e.g., in the expansion chamber and in the warm chamber) within the expander unit. Thus, the parallel arrangement may enable generation of a drag force that is distributed more uniformly across the cross section of the displacer tube than would be generated by another arrangement, such as stacked meshes or randomly oriented fibers. When the flow of the gaseous working agent through the parallel arrangement is treated as a quasi-laminar flow, the resulting drag force may be assumed to be proportional to the square of the relative velocity of the regenerative heat exchanger and the flow of the gaseous working agent. On the other hand, gaseous flow through a regenerative heat exchanger that is constructed of stacked meshes or randomly oriented fibers would constantly change direction in traversing the regenerative heat exchanger.

The pressure drop across the regenerative heat exchanger with parallel fibers is reduced relative to other arrangements, while the rate of heat exchange is increased. For example, some studies have shown a fourfold improvement in performance of an expander unit with a parallel strand regenerative heat exchanger over expander units with stacked-mesh regenerative heat exchangers.

A parallel strand regenerative heat exchanger may be constructed of filaments of metal or of polymer (e.g., nylon, polyester, or other suitable polymer). Use of polymer filaments may be advantageous over metal filaments. Due to the high thermal conductivity of many metals, heat may be conducted through a metal filament from a proximal warm end of the filament the distal cold end of the filament. This parasitic axial heat flow may reduce, e.g., partially counteract, the efficiency of heat pumping. Therefore, replacing metal filaments with polymeric filaments of similar size and surface area, and whose thermal conductivity is significantly less than that of a similar metal filament but whose heat capacity is similar to that of metal, may further increase the efficiency of the thermal cycle of the expander unit. Furthermore, use of polymer filaments may enable simple and repeatable construction of a regenerative heat exchanger that is both lightweight and inexpensive.

In some examples, for a parallel strand regenerative heat exchanger having an outer diameter in the range of 3 mm to 10 mm and a length in the range of 20 mm to 50 mm, a suitable diameter of each parallel strand may be in the range of 5 µm to 10 µm, with a porosity factor in the range of 75% to 90%.

The expander unit, in accordance with an embodiment of the invention, includes a magnetic spring assembly that is constructed of stationary and movable permanent magnets. The magnetic spring operates on the basis of a superposition (e.g., vector sum) of attractive and repulsive forces that are exerted between like and unlike poles of the stationary and movable permanent magnets.

The magnetic spring assembly may include a movable component that is configured to move with the moving assembly of the expander unit, and a stationary component of the magnetic spring assembly that is fixed relative to the walls of the expander unit. Typically, the stationary component is fixed within or outside the base of the cold finger and the movable component is attached to the warm side of displacer. Since the moving assembly does not include a driving rod whose diameter is smaller than that of the remainder of the moving assembly, and that extends proximally to one end a spring whose other end is attached to the rear wall of the base, the expander unit is herein referred to as a rodless expander unit.

In some embodiments, the magnetic spring assembly may include a stationary magnetic assembly that is fixed to the cold finger base, and a movable magnetic assembly that is fixed to the moving assembly. The stationary magnetic assembly may include one or more magnetic rings that are arranged in fixed positions about a bore. The movable magnetic assembly may include one or more movable magnetic rings that are fixed to the moving assembly. An outer lateral dimension (e.g., diameter, width, major axis, or other appropriate lateral dimension) of each of the movable magnetic rings is less than an inner lateral dimension of the bore. The stationary magnetic assembly and the movable magnetic assembly are configured such that, when the moving assembly is displaced along the longitudinal axis from an equilibrium position, attractive and repulsive forces between the movable magnetic assembly and the stationary magnetic assembly yield a restoring force that is directed to restore the moving assembly to the equilibrium position.

In one embodiment, the magnetic spring assembly may include at least two identical exterior permanent magnetic rings that are arranged at different positions along the longitudinal axis of the cold finger tube (corresponding to the axis of linear motion of the displacer tube and moving assembly). The two exterior permanent magnets may be fixed to the base or other wall of the expander unit to form the stationary component. The two exterior stationary magnetic rings may be separated from one another by a spacer that is constructed of a nonmagnetic material. A third interior magnetic ring forms the other, movable component, respectively, of the magnetic assembly. The movable magnetic ring is positioned such that relative motion along the longitudinal axis between the moving assembly and the base (e.g., as limited by the lengths of the moving assembly, the cold finger, and the base) may alternately bring the movable magnetic ring to the position of each of the stationary magnetic rings (e.g., but not past the positions of the stationary magnetic rings).

All three of the magnets are identically axially magnetically polarized parallel to the longitudinal axis of motion of the displacer tube and moving assembly. All of the magnets are arranged coaxially along the longitudinal axis.

In this embodiment, an external structure that includes the two stationary magnetic rings and the spacer surrounds an interior longitudinal bore that is characterized by an inner lateral dimension (e.g., a diameter of the bore). An outer dimension (e.g., outer diameter) of internal structure that includes the movable magnetic ring and the regenerative heat exchanger is less than the inner lateral dimension of the bore, such that the internal structure fits within the bore. Longitudinal motion includes moving the internal structure relative to the external structure.

Because of the difference in outer diameter of the movable magnetic ring and inner diameter of the stationary magnetic rings, the attraction of the unlike poles which are in the closest proximity to each other may be partially balanced by the repelling action of the distal like poles.

When the movable magnetic ring is at an equilibrium position, e.g., midway between the stationary magnetic rings, the attractive and repulsive forces may balance one another. Thus, the net force that is exerted on the movable magnetic ring is zero.

Depending on the balance of attractive and repulsive forces, this equilibrium position may be made stable. When the equilibrium position is stable, any displacement of the movable magnetic ring from its position of working equilibrium may yield a net force that tends to restore the movable ring back toward the equilibrium position. In this case, the restoring force functions as a magnetic spring. Depending on details of the geometry of the magnetic rings, this restoring force may be nonlinear (e.g., hardening or softening) or linear. A linear restoring force, in which the magnitude of the restoring force is proportional to the magnitude of the displacement from the equilibrium position (and directed vectorially opposite to the displacement), may be advantageous for the Stirling cryogenic cooler so as to enable a working frequency that is independent of the amplitude of the motion of the movable ring.

Each movable or stationary magnetic ring may consist of a single solid axially magnetized ring or of a plurality of magnets rings that are azimuthally arranged about the longitudinal axis.

A radial separation between the movable magnetic ring and each of the stationary magnetic rings is at least as large as a radial gap between the outer perimeter of the internal structure and the internal sides of the bore of the external structure. Therefore, when the relative motion brings a pole of the movable magnetic ring near the opposite pole of one of the stationary magnetic rings, the radial separation prevents physical contact between the opposite poles, and thus prevents the movable magnetic ring from adhering either of the stationary magnetic rings.

Thus, the magnetic spring assembly operates on the basis of a superposition of repulsion forces between like poles and attractive forces between opposite poles. It should be further noted that the strength of the magnetic field that is formed by each magnet (e.g., as visualized by density of magnetic field lines) is stronger near the poles of the magnet than alongside the magnet. For example, when the moving assembly is at an equilibrium position, the movable magnetic ring may be at a position that is equidistant from both stationary magnetic rings. Thus, at the equilibrium position, the attractive and repulsive forces between the movable magnetic ring and each stationary magnetic ring are equal and opposite. Thus, at the equilibrium position, no net force is exerted by the magnetic spring. On the other hand, when the movable magnetic ring begins to approach one of the stationary magnetic rings, the magnets may exert a restoring force that is directed so as to return the moving assembly to the equilibrium position. For example, if the north pole of the movable magnetic ring approaches the south pole of one of the stationary magnetic rings (a first stationary magnetic ring), the attraction between the south pole of the movable ring and the north pole of the other (second) stationary magnetic ring (from which the movable magnetic ring is moving away) may begin to increase. Concurrently, the attraction between the north pole of the movable magnetic ring and the south pole of the first stationary magnetic ring may decrease (due to increasing angle between the north pole and the axis of that exterior magnet), while repulsion between the north pole of the movable magnetic ring and the north pole of the first stationary magnetic ring increases.

Such a magnetic spring assembly, which operates on the basis of superposition of both repulsion and attraction between the interior magnet and the exterior magnets, may be designed to have a magnitude independent spring constant (e.g., the spring constant being independent of the magnitude of the displacement from the equilibrium position). One or more design parameters of the magnetic spring assembly may be adjusted to achieve a magnitude independent spring constant. For example, the size of the radial separation between the movable magnetic ring and the stationary magnetic rings may be adjusted to obtain such a magnitude independent spring constant. Other geometrical or magnetic properties (e.g., dimensions or magnetization of one or more of the movable or stationary magnetic rings, or other properties) may be adjusted when designing to achieve the magnitude independent spring constant. The resulting spring constant may be determined either experimentally or by detailed calculations of the resulting forces. Calculations may be assisted using one or more finite element magnetostatic (e.g., ANSYS Maxwell™ software or similar) simulation programs. Thus, the restoring force may be made to be linearly proportional to the displacement of the moving assembly from its equilibrium position, and the resonant frequency of the moving assembly may be independent of amplitude of the motion. For example, if the mass of the moving assembly is M and the driving frequency is f, the magnetic spring assembly may be designed to have a spring constant $K=(2\pi f)^2 M$ in order match the resonant frequency of the moving assembly to the driving frequency, or vice versa.

An expander unit with a magnetic spring that operates on the basis of the superposition of attractive and repulsive forces, as described herein, may be advantageous over an expander unit with other types of springs.

For example, when the spring is a mechanical spring, the mechanical spring would typically occupy a significant fixed volume of space (e.g., in the base), thus reducing the compression ratio and resulting in increased parasitic losses. In addition, a mechanical spring could introduce lateral forces and parasitic friction, the spring may fatigue, and may release foreign particles that could interfere with motion of the moving assembly, and could complicate assembly by the need to anchor both ends of the spring. Since the fixed volume of space does not change, the efficiency of the changes in pressure in producing a drag force on the regenerative heat exchanger may be reduced. Furthermore, in some cases use of a mechanical spring would require a rod that connects the spring with the moving assembly, possibly increasing the required accuracy, and thus the complexity and expense of, assembling the expander unit.

A magnetic spring that operates on the basis of repulsive action only would typically include an interior magnetic ring that extends laterally outward from the moving assembly, and that is configured to travel axially between two repulsive exterior magnets rings. Thus, the space in which the interior repulsive magnet travels would have a fixed volume (e.g., along the side of the moving assembly), and thus also reduce the compression ratio and increase parasitic losses.

Furthermore, due to the inverse square dependence of the repulsive force on distance between the magnets, the relation between position of the moving assembly and the restoring force would be essentially nonlinear. Thus, any change in amplitude of the motion of the moving assembly, e.g., due to change in the ambient temperature, would be accompanied by a change in the resonant frequency, thus reducing the efficiency of the cryocooler that is working at a fixed driving frequency. Use of a smart controller and variable driving frequency to compensate for the nonlinearity would add additional complication and expense to the cryogenic refrigeration device.

On the other hand, an expander unit, in accordance with embodiments of the present invention, that includes a magnetic spring in which the internal structure moves within a bore of the external structure, may be constructed with no fixed unoccupied volumes. The moving assembly may be moved back and forth within the entire the expander unit along the entire length of the cold finger and base. Any other space that is not occupied by magnets may be filled with spacers. As stated above, a magnetic spring that is based on both attraction and repulsion may be designed to have a magnitude independent spring constant, such that the resonance frequency is independent of the amplitude of the motion of the moving assembly.

Furthermore, as stated above, the regenerative heat exchanger may be constructed of longitudinally oriented parallel strands, e.g., that are made of polymer or otherwise. In this case, the resulting uniform axial flow of gas through the longitudinally oriented parallel strands may increase the uniformity and magnitude of the drag force, as well as increase the heat exchange rate within the regenerative heat exchanger. As a result, the thermodynamic efficiency of the cooling cycle may be greater than that of a heat exchanger with otherwise oriented strands or meshes.

In another embodiment, the stationary part of the magnet spring may include a single tubular elongated magnet having an axial direction of magnetization that is opposite to the direction of magnetization of the movable magnetic ring.

In other embodiments, the directions of magnetization of movable and stationary magnetic rings may be perpendicular to the longitudinal axis.

For example, the movable magnetic ring may include a radially magnetized ring (e.g., constructed of a plurality of linearly magnetized components that are assembled into a ring where each pair of adjacent components are oriented at different azimuth angles). The stationary part includes a single ring with the same radial magnetization as the movable ring.

In another example, the movable magnetic ring may include a diametrically magnetized ring (e.g., magnetized along a diameter of the ring) and the stationary part includes a single diametrically magnetized ring whose magnetic axis is oriented identically to that of the movable ring.

In these embodiments also, the magnetic spring operates on the basis of the superposition of attractive and repulsive forces existing between the poles of the stationary and movable magnetic rings. Linearization of the restoring force may be primarily achieved by choosing an optimum radial separation between exterior surface of the movable magnetic ring and the interior surface of the stationary magnetic tube.

In another embodiment, the movable or stationary magnetic assembly may be replaced with a ring of ferromagnetic material. In this embodiment, all of the forces are attractive. The other assembly may include a single magnetized ring whose length is sufficiently long such that during motion of the moving assembly along the longitudinal axis, no part of the length of the ferromagnetic ring extends axially beyond the length of the axially magnetized ring. The magnetized ring may be axially magnetized parallel to the longitudinal axis, or radially or diametrically magnetized perpendicular to the longitudinal axis. The ferromagnetic ring may be radially laminated or include an axial slot to prevent generation of eddy currents (which could produce parasitic damping forces). The restoring force may be linearized by adjusting a radial separation between the ferromagnetic ring and the magnetic ring.

Figure 1:
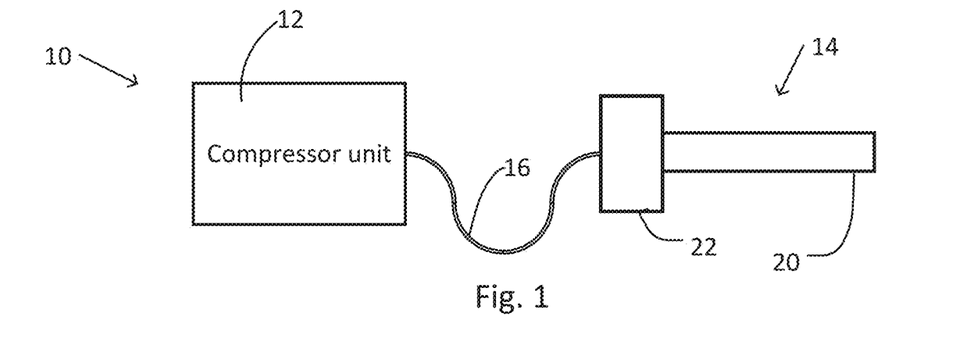
FIG. 1 schematically illustrates a split Stirling cryogenic refrigeration device with a rodless pneumatic expander unit with a magnetic spring, in accordance with an embodiment of the present invention.
Figure 2:
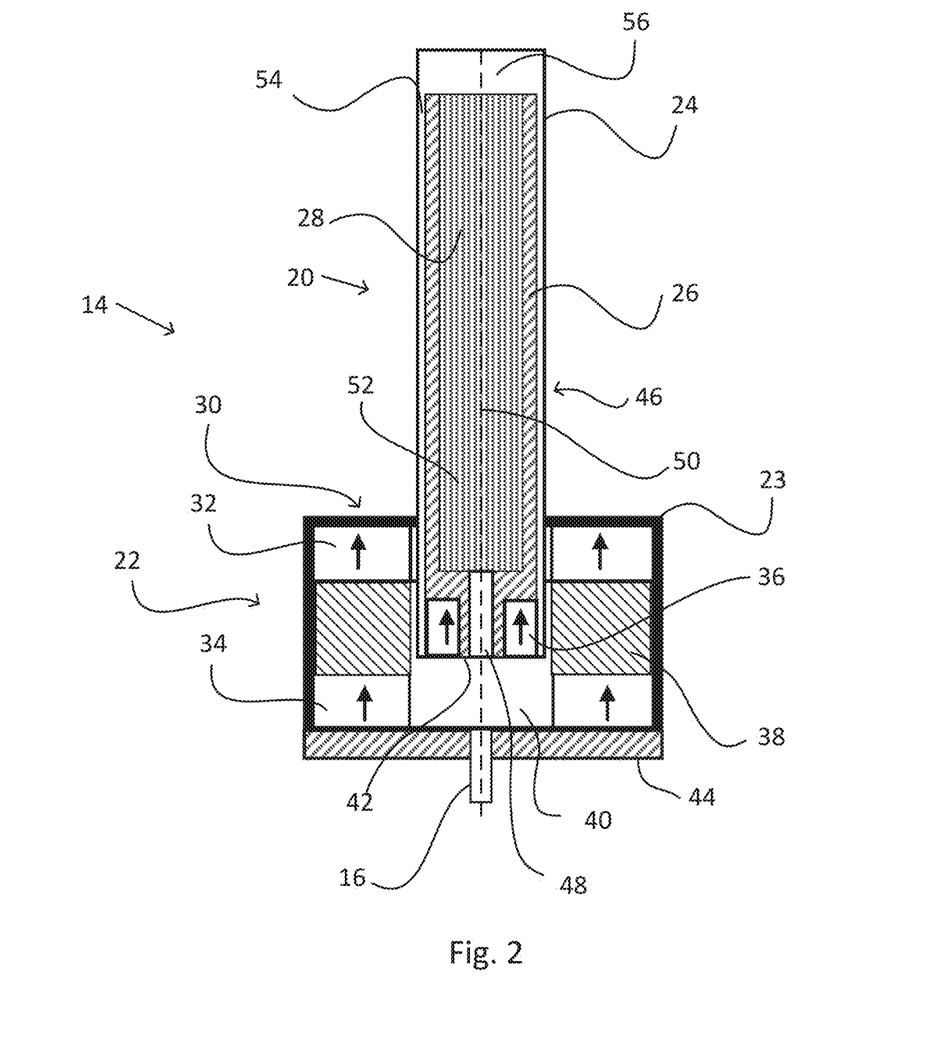
FIG. 2 is a schematic cross section of an embodiment of the rodless pneumatic expander unit shown in FIG. 1.

FIG. 1 schematically illustrates a split Stirling cryogenic refrigeration device with a rodless pneumatic expander unit with a magnetic spring, in accordance with an embodiment of the present invention. FIG. 2 is a schematic cross section of an embodiment of the rodless pneumatic expander unit shown in FIG. 1.

Split Stirling cryogenic refrigeration device 10 includes compressor unit 12 and rodless expander unit 14. A gaseous working agent (typically an inert gas, such as helium or nitrogen) may be cyclically compressed and decompressed within a compression chamber (not shown) of compressor unit 12, e.g., by an electromagnetically powered linear piston compressor, or another piston compressor. The gaseous working agent in a compression chamber of the compressor unit 12 is in direct pneumatic communication with a warm chamber 40 in cold finger base 22 of expander unit 14 via flexible transfer line 16. The gaseous working agent may flow between cold finger base 22 and the interior of cold finger 20 via conduit 48. Cold finger 20 of rodless expander unit 14, e.g., a distal end of cold finger tube 24 adjacent to expansion chamber 56, may be placed in thermal contact with an object that is to be cooled.

Cold finger 20 of rodless expander unit 14 is contained within cold finger tube 24. Cold finger tube 24 is impermeable to the gaseous working agent but is configured (e.g., by choice of material and thickness of the wall of cold finger tube 24) to minimize parasitic conduction of heat along cold finger tube 24. Typically, cold finger tube 24 is in the form of an elongated, thin-walled circular cylinder with longitudinal axis 50 that is constructed of a nonmagnetic metal alloy with low thermal conductivity. Such metals or alloys may include titanium, stainless steel, cobalt alloy L605, or another suitable material.

Expansion chamber 56, at the distal end of cold finger tube 24, may be periodically fully or partially occupied by the distal end of displacer tube 26 of moving assembly 46.

Cold finger base 22 is enclosed by base walls 23 and sealed by a rear cover 44. Cold finger base walls 23 may be cylindrical or may have another shape. Cold finger tube 26, base walls 23, and rear cover 44 together form a housing that encloses the gaseous working agent and isolates the gaseous working agent from the ambient atmosphere.

Warm chamber 40, which is pneumatically connected to compressor unit 12 via transfer line 16, and which may be periodically fully or partially occupied by the proximal end of moving assembly 46, is the only space within warm chamber 40 that may be filled with the gaseous working agent. The remainder of cold finger base 22 is filled with the stationary components of the magnetic spring 30, thus minimizing fixed unoccupied volume within cold finger base 22.

A distal end of moving assembly 46 includes displacer tube 26, and a proximal end of moving assembly 46 includes a moving component of magnetic spring 30.

Displacer tube 26 partially encloses regenerative heat exchanger 28. A distal end of displacer tube 26 is open to enable flow of the gaseous working agent between expansion chamber 56 and a distal cold end of regenerative heat exchanger 28, e.g., when moving assembly 46 moves distally within cold finger tube 24. A proximal end of displacer tube 26 is open to conduit 48 to enable the gaseous working agent to flow between a proximal warm end of regenerative heat exchanger 28 and warm chamber 40 in cold finger base 22, e.g., when moving assembly 46 moves proximally within cold finger tube 24.

Radial clearance gap 54 between the outer surface of displacer tube 26 and the inner surface of cold finger tube 24 may be sufficiently large so as to enable unobstructed motion of moving assembly 46 along longitudinal axis 50 without excessive interference or friction. On the other hand, radial clearance gap 54 may be sufficiently small so as to form a close clearance seal to impede parasitic flow of the gaseous working agent between expansion chamber 56 and warm chamber 40 via radial clearance gap 54. Thus, due to the effect of the close clearance seal, the gaseous working agent is constrained to flow through regenerative heat exchanger 28, thus transferring heat from expansion chamber 56 to warm chamber 40 during motion of moving assembly 46.

A minimum and maximum size of radial clearance gap 54 for efficient operation of rodless pneumatic expander unit 14 may depend, in part, on the length and diameter (or other lateral dimension) of displacer tube 26. For example, when the outer diameter of displacer tube 26 is in the range of 5 millimeters to 10 millimeters, and the length of displacer tube 26 is in the range of 20 millimeters to 50 millimeters, a suitable size of radial clearance gap 54 may be about 50 micrometers.

In the example shown, the stationary magnetic assembly of magnetic spring 30 includes distal stationary magnetic ring 32 and proximal stationary magnetic ring 34. Distal stationary magnetic ring 32 and proximal stationary magnetic ring 34 are axially magnetized in identical directions parallel to longitudinal axis 50, as indicated by the arrows in each of distal stationary magnetic ring 32 and proximal stationary magnetic ring 34. Each of distal stationary magnetic ring 32 and proximal stationary magnetic ring 34 includes a permanently magnetized solid ring that surrounds a circular bore that includes or accommodates warm chamber 40. Alternatively, each of distal stationary magnetic ring 32 and proximal stationary magnetic ring 34 may include an arrangement of permanent magnets that are arranged azimuthally about warm chamber 40 and longitudinal axis 50. Such an arrangement of permanent magnets may be arranged symmetrically about longitudinal axis 50. Distal stationary magnetic ring 32 and proximal stationary magnetic ring 34 are arranged coaxially with longitudinal axis 50.

Spacer 38 fills the axial, otherwise unoccupied, space between distal stationary magnetic ring 32 and proximal stationary magnetic ring 34. Spacer 38 may be constructed of a nonmagnetic material that is impermeable to the gaseous working agent. In the example shown, spacer 38 is in the form of a ring with internal and external diameters substantially equal to those of distal stationary magnetic ring 32 and proximal stationary magnetic ring 34. When one or both of distal stationary magnetic ring 32 and proximal stationary magnetic ring 34 are constructed of an arrangement of separate magnets, the material of spacer 38 may also fill any azimuthal spaces (e.g., annular sectors) between those magnets.

In some cases, spacer 38 may be provided with fins that face warm chamber 40 so as to intensify or accelerate heat exchange between warm chamber 40 and spacer 38, and thus facilitate the removal of the compression heat from warm chamber 40.

In the example shown, the movable magnetic assembly of magnetic spring 30 includes movable magnetic ring 36, which is located at a proximal end of moving assembly 46. Movable magnetic ring 36 is magnetized in the same axial direction as distal stationary magnetic ring 32 and proximal stationary magnetic ring 34, as indicated by the arrows in movable magnetic ring 36. Movable magnetic ring 36 includes a permanently axially magnetized solid ring that surrounds a circular bore that includes or surrounds conduit 48. Alternatively, movable magnetic ring 36 may include an arrangement of permanent magnets that are arranged azimuthally about conduit 48 and longitudinal axis 50. Such an arrangement of permanent magnetic rings may be arranged symmetrically about longitudinal axis 50. Movable magnetic ring 36 is arranged coaxially with distal e stationary magnetic ring 32 and proximal stationary magnetic ring 32.

As described above, at an equilibrium position of moving assembly 46, movable magnetic ring 36 is equidistant from distal stationary magnetic ring 32 and from proximal stationary magnetic ring 34, with equal and opposite repulsive and attractive forces acting between movable magnetic ring 36 and each of distal stationary magnetic ring 32 and proximal stationary magnetic ring 34. As moving assembly 46 moves distally from the equilibrium position, the repulsive force between movable magnetic ring 36 and distal stationary magnetic ring 32 may increase, as does the attractive force between movable magnetic ring 36 and proximal stationary magnetic ring 34. Thus, the net force on movable magnetic ring 36 tends to restore moving assembly 46 to the equilibrium position. Similarly, as moving assembly 46 moves proximally from the equilibrium position, the attractive force between movable magnetic ring 36 and distal stationary magnetic ring 32 may increase, as does the repulsive force between movable magnetic ring 36 and proximal stationary magnetic ring 34.

As described above, movable magnetic ring 36, distal stationary magnetic ring 32, and proximal stationary magnetic ring 34 such that the net restoring force that is applied to movable magnetic ring 36 increases linearly with displacement of moving assembly 46 from the equilibrium position. When the restoring force is a linear function of displacement, the resonant frequency of motion of moving assembly 46 as determined by the mass of moving assembly 46 and the magnetic spring constant of magnetic spring 30, is independent of the amplitude of the movement of moving assembly 46 within cold finger tube 24.

Figure 3:
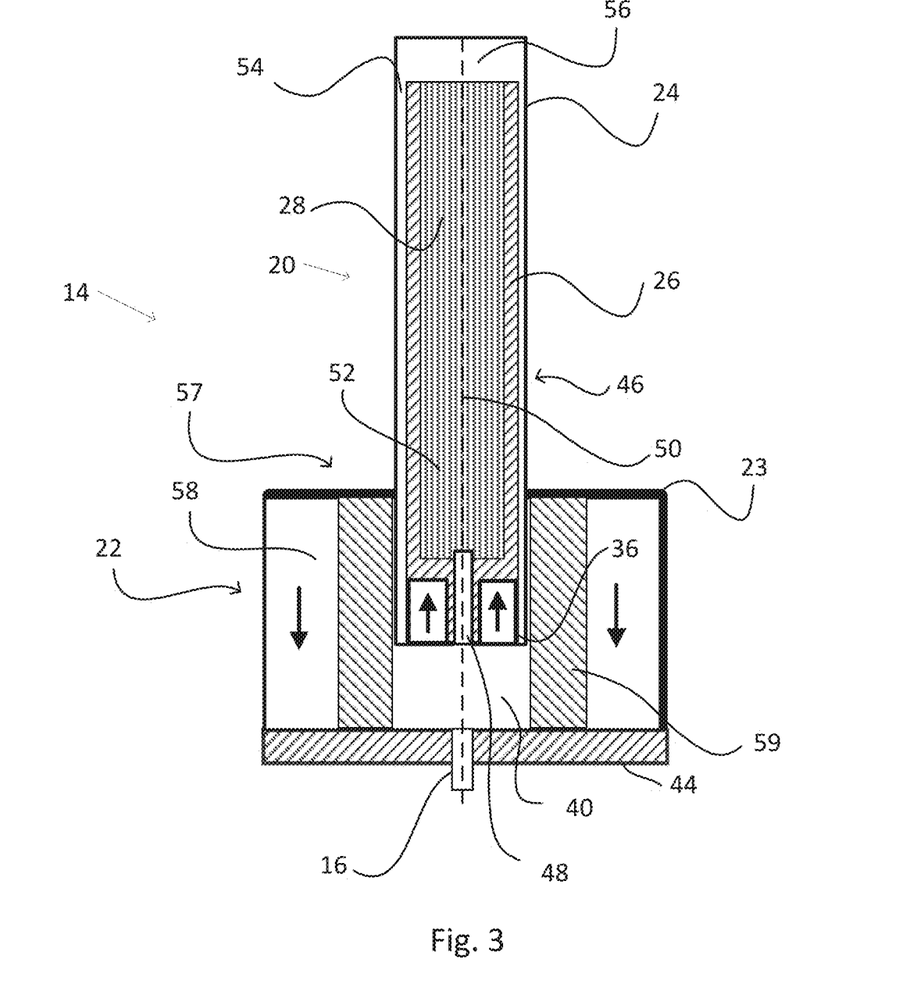
FIG. 3 is schematic cross section of a variant of the rodless pneumatic expander unit shown in FIG. 2, in which the stationary magnetic assembly of the magnetic spring includes a single axially magnetized ring.

FIG. 3 is schematic cross section of a variant of the rodless pneumatic expander unit shown in FIG. 2, in which the stationary magnetic assembly of the magnetic spring includes a single axially magnetized ring.

In the example shown, a stationary magnetic assembly of magnetic spring 57 includes a single tubular magnet 58. Tubular magnet 58 is axially magnetized in a direction that is opposite the axial direction of magnetization of movable magnetic ring 36. The attractive and repulsive forces between the poles of tubular magnet 58 and movable magnetic ring 36 may function as a magnetic spring. A radial space of cold finger base 22 between warm chamber 40 and tubular magnet 58 may be filled with nonmagnetic cylindrical spacer 59. Adjustment of the thickness of the radial space, or another design parameter, may yield a magnitude independent magnetic spring constant. Stationary tubular magnet 58 may be placed externally relatively to the cold finger base 23 (outside the pressure vessel).

Figure 4A:
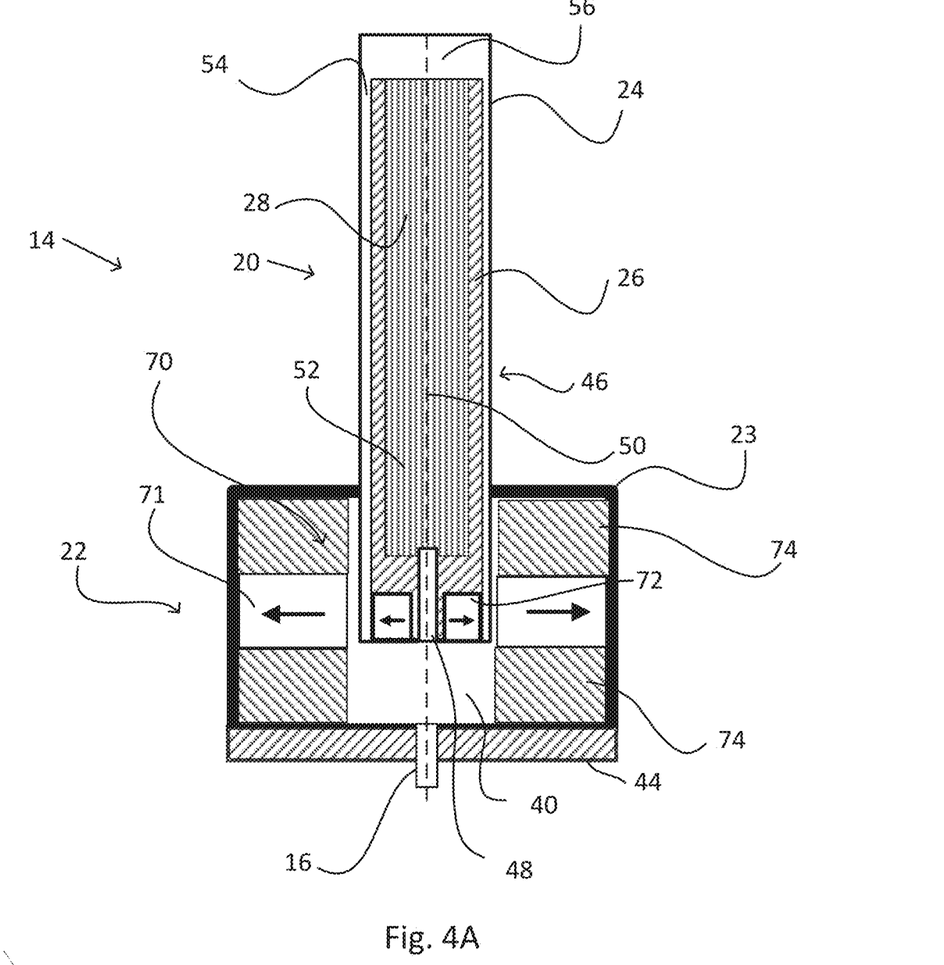
FIG. 4A is schematic cross section of a variant of the rodless pneumatic expander unit shown in FIG. 3, in which the stationary and movable magnetic rings are radially magnetized.
Figure 4B:
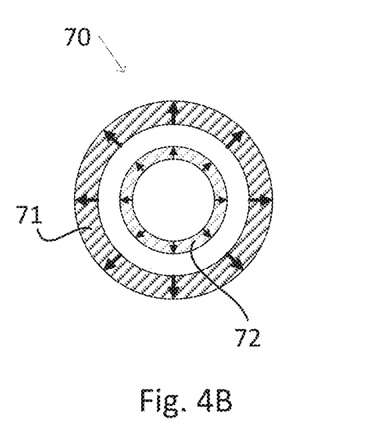
FIG. 4B schematically illustrates the directions of magnetization of the radially magnetized rings of the expander unit shown in FIG. 4A.

FIG. 4A is schematic cross section of a variant of the rodless pneumatic expander unit shown in FIG. 3, in which the stationary and movable magnetic rings are radially magnetized. FIG. 4B schematically illustrates the directions of magnetization of the radially magnetized rings of the expander unit shown in FIG. 4A.

In magnetic spring 70, stationary magnetic ring 71 and movable magnetic ring 72 are identically radially magnetized. The axial length of stationary magnetic ring 71 is sufficiently longer than that of movable magnetic ring 72 such that during motion of moving assembly 46, the magnetic pole on the exterior surface of movable magnetic ring 72 continues to be attracted by the magnetic pole on the interior surface of stationary magnetic ring 71. The length of the radial gap between movable magnetic ring 72 and stationary magnetic ring 71 may be adjusted to obtain a magnitude independent magnetic spring constant for magnetic ring 70.

Any regions of cold finger base 22 outside of warm chamber 40 that are not occupied by stationary magnetic ring 71 may be filled with nonmagnetic cylindrical spacers 74 in order to decrease or eliminate fixed unoccupied volumes.

In other examples, stationary magnetic ring 71 may be located radially outside of cold finger base 22. Placement of stationary magnetic ring 71 outside of cold finger base 22 may isolate any outgassing products of stationary magnetic ring 71 from contaminating the gaseous working agent. In addition, external placement of stationary magnetic ring 71 may facilitate fine radial centering of moving assembly 46 within expander unit 14.

A radially magnetized magnetic ring may be assembled from a plurality of linearly magnetized segments, or may be manufactured using specialized sintering techniques and equipment.

Figure 4C:
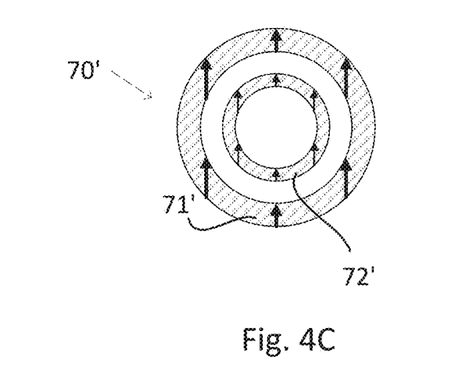
FIG. 4C schematically illustrates the magnetization of diametrically magnetized rings of the expander unit shown in FIG. 4A.

A variant of magnetic spring 70 may include diametrically magnetized rings.

FIG. 4C schematically illustrates the magnetization of diametrically magnetized rings of the expander unit shown in FIG. 4A.

In magnetic spring 70', stationary magnetic ring 71' and movable magnetic ring 72' are diametrically magnetized in a single direction. Use of diametrically magnetized rings may be easier and less expensive to produce than radially magnetized rings (e.g., by linearly magnetizing a ferromagnetic ring in a lateral direction). In addition, the azimuthal asymmetry of diametrically magnetized rings may prevent or impede unfavorable rotation of moving assembly 46.

In other examples, stationary magnetic ring 71' may be located outside of cold finger base 22.

Figure 5:
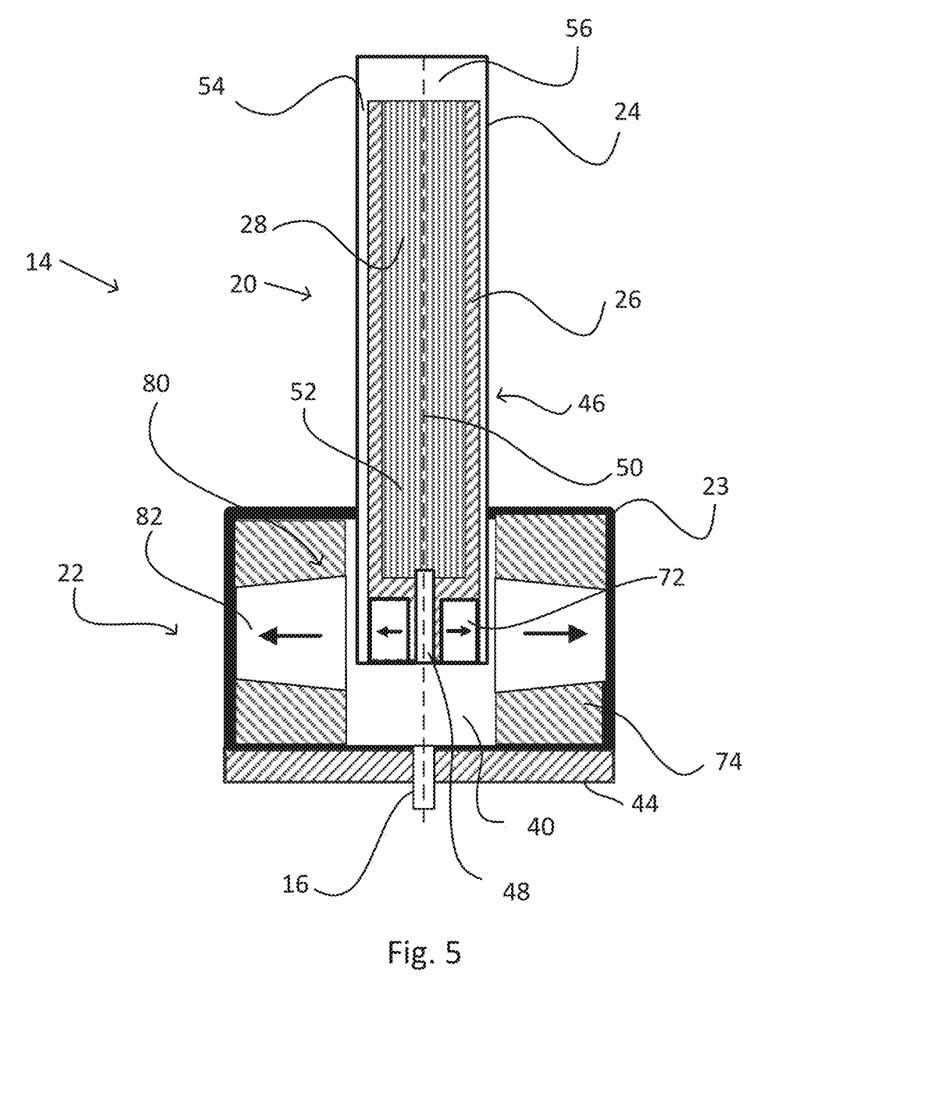
FIG. 5 is a schematic cross section of a variant of the rodless pneumatic expander unit shown in FIG. 4A, in which the stationary magnetic rings have a trapezoidal cross section.

FIG. 5 is schematic cross section of a variant of the rodless pneumatic expander unit shown in FIG. 4A, in which the stationary magnetic rings have a trapezoidal cross section.

In magnetic spring 80, stationary magnetic ring 82 has a trapezoidal cross section, in which a wide base of the trapezoidal cross section faces radially inward toward movable magnetic ring 72, and a narrow base faces radially outward. The inward facing of the wide base may increase magnetic attraction between stationary magnetic ring 82 and movable magnetic ring 72.

In other examples, stationary magnetic ring 82 may be located outside of cold finger base 22.

Other arrangements of magnets of a magnetic spring may be used. For example, magnet rings may be of polygonal (pentagonal, hexagonal, or other polygonal) shape.

In accordance with some embodiments, either the stationary or movable assembly of the magnetic spring may include only ferromagnetic material, while the other includes a magnetic ring.

Figure 6:
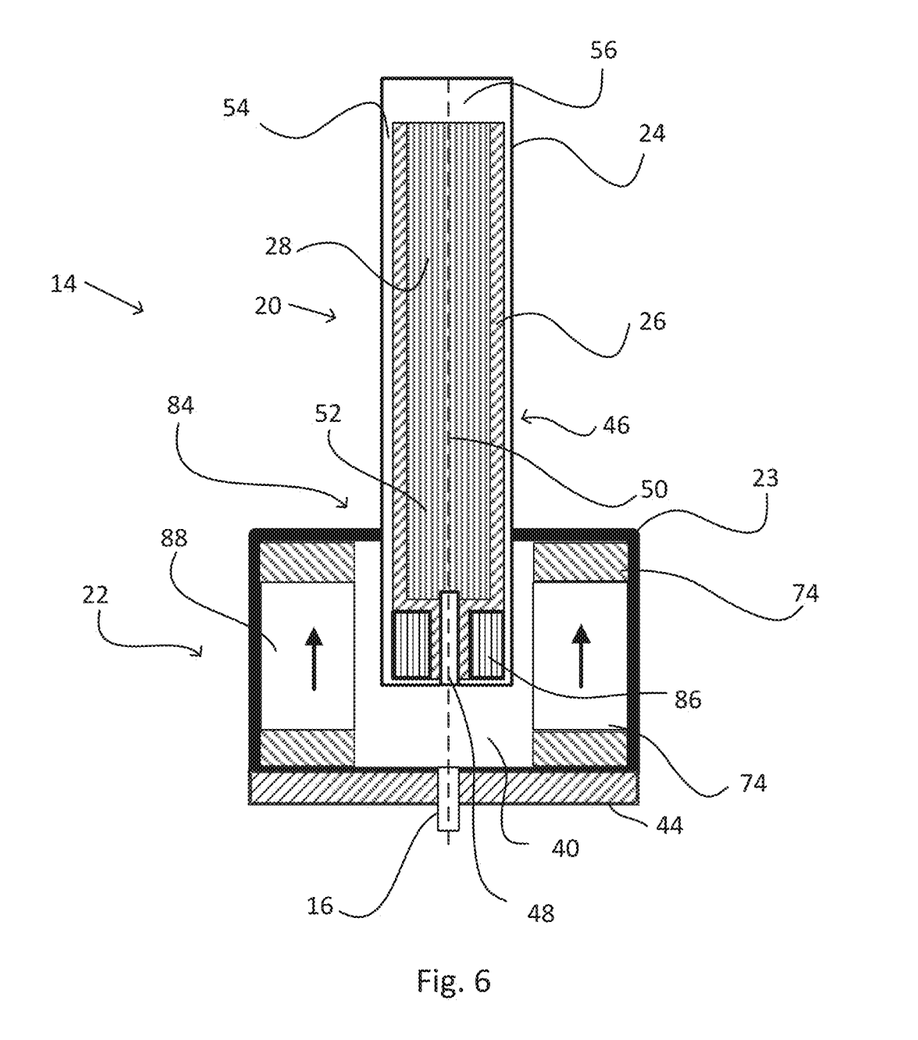
FIG. 6 is schematic cross section of a variant of the rodless pneumatic expander unit shown in FIG. 2, in which the stationary assembly of the magnetic spring includes a ring of ferromagnetic material.

FIG. 6 is schematic cross section of a variant of the rodless pneumatic expander unit shown in FIG. 2, in which the stationary assembly of the magnetic spring includes a ring made of ferromagnetic material.

In the example shown, the stationary assembly of magnetic spring 84 includes a single tubular magnet 88. In the example shown, tubular magnet 88 is in the form of an axially magnetized cylindrical tube with a rectangular cross section. In other examples, tubular magnet 88 may be radially or diametrically magnetized (e.g., as schematically illustrated in FIGS. 4B and 4C, respectively), or with a trapezoidal (e.g., as schematically illustrated in FIG. 5) or otherwise shaped cross section.

The movable assembly of magnetic spring 84 includes a ferromagnetic ring 86, which is constructed of ferromagnetic material. In the example shown, ferromagnetic ring 86 has a rectangular cross section. In other examples, ferromagnetic ring 86 may have a trapezoidal or otherwise shaped cross section.

An outer lateral dimension of ferromagnetic ring 86 is less than an inner lateral dimension of tubular magnet 88. Tubular magnet 88 is sufficiently long in the axial direction (parallel to longitudinal axis 50) such that during motion of moving assembly 46, ferromagnetic ring 86 remains within the bore of tubular magnet 88.

Thus, magnetic spring 84 operates on the basis of magnetic attractive forces only. For example, at an equilibrium position where ferromagnetic ring 86 is located midway between the ends of tubular magnet 88, ferromagnetic ring 86 is equally attracted to both ends of tubular magnet 88 and the net force is zero. When ferromagnetic ring 86 is axially displaced toward one end of tubular magnet 88, the resulting asymmetry of the attractive forces may pull ferromagnetic ring 86 back toward the equilibrium position. A radial separation distance between ferromagnetic ring 86 and tubular magnet 88 may be selected such that the axial restoring force is linearly proportional to the length of the displacement from the equilibrium position.

In some examples, ferromagnetic ring 86 may include radial lamination (e.g., electrically insulating layers sandwiched between layers of electrically conductive ferromagnetic material), may include one or more axial slots. The lamination or slotting may limit the generation of parasitic eddy currents, which could damp the motion of moving assembly 46. Stationary magnet 88 may be placed externally to cold finger base 23.

In other examples, a tubular magnet may form the moving magnetic assembly, while a stationary ferromagnetic ring mounted at an appropriate location may form the stationary assembly of the magnetic spring.

Figure 7:
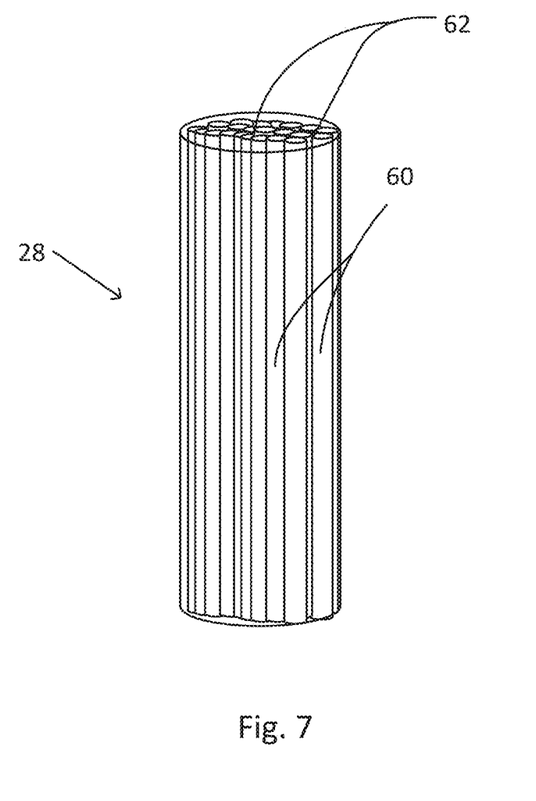
FIG. 7 schematically illustrates components of a regenerative heat exchanger with parallel polymeric fibers, in accordance with an embodiment of the invention.

In some embodiments of the invention, regenerative heat exchanger 28 may be constructed of filaments of a polymeric material that are packed together such that the filaments (also referred to herein as fibers, strands, or wires) are oriented parallel to one another. For example, the polymeric material may include nylon, polyester, or another suitable polymeric material.

FIG. 7 schematically illustrates components of a regenerator with parallel polymeric filaments, in accordance with an embodiment of the invention.

As shown, regenerative heat exchanger 28 is filled with a plurality of parallel polymeric filaments 60. Parallel polymeric filaments 60 are oriented along a long axis of regenerative heat exchanger 28. Thus, the orientation of parallel polymeric filaments 60 is parallel to longitudinal axis 50 when regenerative heat exchanger 28 is incorporated into rodless pneumatic expander unit 14.

Typically, parallel polymeric filaments 60 may be close packed (e.g., hexagonally close packed) within regenerative heat exchanger 28 such that each parallel polymeric filament 60 abuts each (e.g., six, or another number of) its neighboring parallel polymeric filaments 60. The spaces between parallel polymeric filaments 60 form longitudinal channels 62. When moving assembly 46 is moved distally or proximally along longitudinal axis 50 within cold finger tube 24, the gaseous working agent that fills cold finger tube 24 may flow within longitudinal channels 62.

Different embodiments are disclosed herein. Features of certain embodiments may be combined with features of other embodiments; thus, certain embodiments may be combinations of features of multiple embodiments. The foregoing description of the embodiments of the invention has been presented for the purposes of illustration and description. It is not intended to be exhaustive or to limit the invention to the precise form disclosed. It should be appreciated by persons skilled in the art that many modifications, variations, substitutions, changes, and equivalents are possible in light of the above teaching. It is, therefore, to be understood that the appended claims are intended to cover all such modifications and changes as fall within the true spirit of the invention.

While certain features of the invention have been illustrated and described herein, many modifications, substitutions, changes, and equivalents will now occur to those of ordinary skill in the art. It is, therefore, to be understood that the appended claims are intended to cover all such modifications and changes as fall within the true spirit of the invention.

The invention claimed is:

1. An expander unit of a cryogenic refrigerator device, the expander unit comprising:
a cold finger tube extending distally from a cold finger base and configured to enclose a gaseous working agent, the cold finger base being connectable via a transfer line to a compressor unit;
a moving assembly including a displacer tube containing a porous regenerative heat exchanger that is permeable to the gaseous working agent and that is configured to move back and forth along a longitudinal axis between an expansion chamber at a distal end of the cold finger tube and a warm chamber at a proximal end of the cold finger base as the gaseous working agent is alternately compressed and decompressed by the compressor unit; and
a magnetic spring assembly comprising a stationary magnetic assembly fixed to the cold finger base, the stationary magnetic assembly including one or more magnetic rings fixedly arranged about a bore, and a movable magnetic assembly that includes one or more movable magnetic rings fixed to the moving assembly, wherein an outer lateral dimension of each of the movable magnetic rings is less than an inner lateral dimension of the bore, and wherein the stationary magnetic assembly and the movable magnetic assembly are configured such that, when the moving assembly is displaced along the longitudinal axis from an equilibrium position, attractive and repulsive forces between the movable magnetic assembly and the stationary magnetic assembly yield a restoring force that is directed to restore the moving assembly to the equilibrium position.

2. The expander unit of claim 1, wherein the stationary magnetic assembly comprises two coaxial stationary magnetic rings that are axially displaced from one another and the movable magnetic assembly comprises one movable magnetic ring, the directions of magnetization of the stationary magnetic rings and the movable magnetic ring being identical to one another and parallel to the longitudinal axis.

3. The expander unit of claim 2, wherein an axial space between the two stationary magnetic rings is filled with a nonmagnetic spacer.

4. The expander unit of claim 1, wherein the stationary magnetic assembly is fixed within the cold finger base or outside of the cold finger base.

5. The expander unit of claim 1, wherein a bore of each of said one or more movable magnetic rings surrounds a conduit that enables the gaseous working agent to flow between the heat exchanger and the warm chamber.

6. The expander unit of claim 1, wherein the heat exchanger comprises a plurality of parallel filaments that are oriented substantially parallel to the longitudinal axis.

7. The expander unit of claim 6, wherein the filaments comprise a polymeric material.

8. The expander unit of claim 7, wherein the polymeric material comprises nylon or polyester.

9. The expander unit of claim 6, wherein the filaments comprise a composite material including metal and polymeric material.

10. The expander unit of claim 1, wherein directions of magnetization of the magnetic rings of the stationary magnetic assembly and the movable magnetic assembly are perpendicular to the longitudinal axis.

11. The expander unit of claim 10, wherein the magnetic rings of the stationary magnetic assembly and the movable magnetic assembly are magnetized radially with respect to the longitudinal axis.

12. The expander unit of claim 10, wherein the magnetic rings of the stationary magnetic assembly and the movable magnetic assembly are magnetized diametrically with respect to the longitudinal axis.

13. The expander unit of claim 10, wherein a cross section of the stationary magnetic ring is trapezoidal.

14. The expander unit of claim 13, wherein a wide base of the trapezoidal cross section faces inward.

15. The expander unit of claim 1, wherein a space within the stationary magnetic assembly or the movable magnetic assembly is filled with a nonmagnetic spacer.

16. The expander unit of claim 1, wherein the stationary magnetic assembly and the movable magnetic assembly are configured such that a magnitude of the restoring force is proportional to the magnitude of the displacement of the moving assembly from the equilibrium position.

17. An expander unit of a cryogenic refrigerator device, the expander unit comprising:
a cold finger tube extending distally from a cold finger base and configured to enclose a gaseous working agent, the cold finger base being connectable via a transfer line to a compressor unit;
a moving assembly including a displacer tube containing a porous regenerative heat exchanger that is permeable to the gaseous working agent and that is configured to move back and forth along a longitudinal axis between an expansion chamber at a distal end of the cold finger tube and a warm chamber at a proximal end of the cold finger base as the gaseous working agent is alternately compressed and decompressed by the compressor unit; and
a magnetic spring assembly comprising a stationary magnetic assembly fixed to the cold finger base, the stationary magnetic assembly including a tubular magnet, and a movable assembly that includes a ferromagnetic ring that is fixed to the moving assembly, an outer lateral dimension of the ferromagnetic ring being less than an inner lateral dimension of the tubular magnet, and wherein the stationary magnetic assembly and the movable assembly are configured such that, when the moving assembly is displaced along the longitudinal axis from an equilibrium position, attractive forces between the movable assembly and the stationary magnetic assembly yield a restoring force that is directed to restore the moving assembly to the equilibrium position.

* * * * *